(12) United States Patent
Chang

(10) Patent No.: US 8,068,372 B2
(45) Date of Patent: Nov. 29, 2011

(54) SEMICONDUCTOR MEMORY DEVICE

(75) Inventor: Tae-Sig Chang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 91 days.

(21) Appl. No.: 12/613,914

(22) Filed: Nov. 6, 2009

(65) Prior Publication Data

US 2011/0002175 A1 Jan. 6, 2011

(30) Foreign Application Priority Data

Jul. 3, 2009 (KR) .................. 10-2009-0060641

(51) Int. Cl.
*G11C 7/00* (2006.01)
(52) U.S. Cl. ............ 365/189.05; 365/189.11; 365/225.7
(58) Field of Classification Search .............. 365/95, 365/105, 175
See application file for complete search history.

(56) References Cited

U.S. PATENT DOCUMENTS 5,914,524 A * 6/1999 Komenaka ............ 257/529
2011/0002176 A1 * 1/2011 Chang ................ 365/189.05

FOREIGN PATENT DOCUMENTS

KR 1020080088171 10/2008

OTHER PUBLICATIONS

Notice of Preliminary Rejection issued from Korean Intellectual Property Office on Mar. 10, 2011.

* cited by examiner

*Primary Examiner* — Tan T. Nguyen
(74) *Attorney, Agent, or Firm* — IP & T Group LLP

(57) ABSTRACT

A semiconductor memory device includes: a repair node; a fuse one side of which is coupled to the repair node; a pull-down unit configured to selectively transfer a ground voltage to the repair node; a pull-up unit configured to selectively transfer a driving voltage to another side of the fuse; and a voltage drop unit coupled between the pull-up unit and the fuse and configured to lower a voltage level of the driving voltage.

8 Claims, 3 Drawing Sheets

SEMICONDUCTOR MEMORY DEVICE

CROSS-REFERENCE TO RELATED APPLICATIONS

The present application claims priority of Korean Patent Application No. 10-2009-0060641, filed on Jul. 3, 2009, which is incorporated herein by reference in its entirety.

BACKGROUND OF THE INVENTION

Exemplary embodiments of the present invention relate to a semiconductor memory device, and more particularly, to a fuse of a semiconductor memory device.

If even a single defect occurs during fabrication of a semiconductor memory device, the device may not function properly as a memory, and thus become defective. Although the defect occurs only in a cell of a memory, the overall device that includes the defective memory cell ("cell") may need to be discarded, which results in inefficient yields.

Now, the inefficiency in yields may be resolved by forming some spare cells inside a memory device, and replacing a defective cell with a spare cell to repair the overall memory. A repair operation using spare cells is generally performed by first pre-installing a spare word line prepared to be replaced with a normal word line and/or a spare bit line prepared to be replaced with a normal bit line. Next, a normal word line, or a normal bit line which includes a defective cell, is replaced with the spare word line or the spare bit line. To be specific, when a defective cell is detected by a wafer test, a program for changing an address of the defective cell with an address of a spare cell may be executed inside an internal circuit. Therefore, when the memory with the defective cell is used, and an address signal indicating the defective cell is input, the data of the spare cell (that replaces the defective cell) is accessed.

A widely used address changing method uses a program to change the path of an address by firing a fuse with a laser beam to blow the fired fuse. For example, a typical semiconductor memory device includes a fuse unit for changing an address path by irradiating a fuse with a laser and blowing the fuse. A fuse unit includes a plurality of fuse sets, each of which can replace one address path. The number of fuse sets in a fuse unit depends on the number of spare word lines or spare bit lines that are provided on the margin area of a semiconductor memory device. Each fuse set may include a plurality of fuses for addresses, and an address path is replaced by selectively blowing the fuses for addresses.

A fuse unit may be provided with multiple fuses and a fuse guard ring for protecting an internal circuit from impurities penetrating the internal circuit through a fuse region. However, the metal around a fuse may be corroded due to a voltage applied to the fuse after the fuse is blown.

SUMMARY OF THE INVENTION

An embodiment of the present invention is directed to a semiconductor memory device that can protect fuses from being corroded.

In accordance with an embodiment of the present invention, a semiconductor memory device includes a repair node; a fuse one side of which is coupled to the repair node; a pull-down unit configured to selectively transfer a ground voltage to the repair node; a pull-up unit configured to selectively transfer a driving voltage to another side of the fuse; and a voltage drop unit coupled between the pull-up unit, and the fuse and configured to lower a voltage level of the driving voltage.

The voltage drop unit may be a diode, and the diode may be implemented with a metal-oxide semiconductor (MOS) transistor.

The pull-up unit may include a P-type MOS (PMOS) transistor receiving a power-up signal through a gate of the PMOS transistor, and the pull-down unit may include an N-type MOS (NMOS) transistor receiving a power-up signal through a gate of the NMOS transistor.

The semiconductor memory device may comprise a latch unit configured to latch a signal at the repair node.

The fuse may be formed of at least one layer selected from the group consisting of a titanium nitride layer and an aluminum layer.

The latch unit may include an inverter and an NMOS transistor coupled between an input of the inverter and a ground voltage supply terminal. The latch unit may also have a gate coupled to an output of the inverter.

DESCRIPTION OF SPECIFIC EMBODIMENTS

Figure 1:
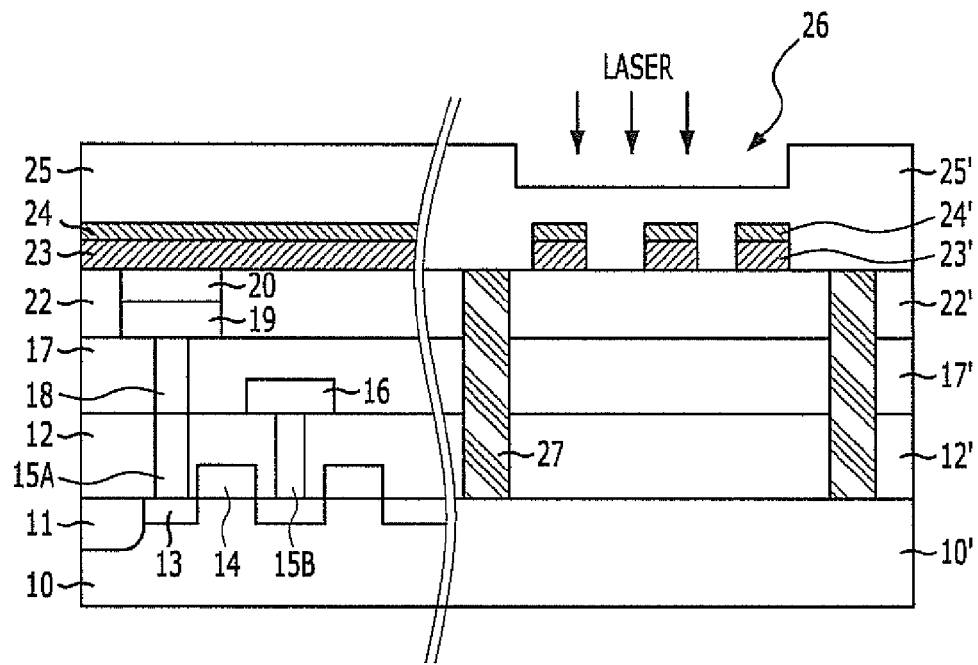
FIG. 1 is a cross-sectional view illustrating a fuse of a semiconductor memory device, according to an embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a cross-sectional view illustrating a fuse of a semiconductor memory device, according to an embodiment of the present invention. The left part of the drawing shows a cross section of a cell region, whereas the right part of the drawing shows a fuse region.

Referring to FIG. 1, a cell region of the semiconductor memory device includes an isolation layer 11, an active region 13, a gate pattern 14, a first storage node contact plug 15A, a second storage node contact plug 18, a bit line contact plug 15B, a bit line 16, inter-layer dielectric layers 12, 17, 22 and 25, and a capacitor including a lower plate electrode 19, a dielectric thin film 20 and a upper plate electrode 23 and 24 over a substrate 10. The upper plate electrode 23 and 24 includes a polysilicon layer 23 and a titanium nitride (TiN) layer 24.

A fuse region of the semiconductor memory device is provided with inter-layer dielectric layers 12', 17' and 22', a fuse including a polysilicon layer 23', and a TiN layer 24', an inter-layer dielectric layer 25' formed in the upper portion of the fuse, and a guard ring 27 for minimizing moisture permeation over a substrate. Also, a fuse box 26 is formed by removing the inter-layer dielectric layer 25' in the upper portion of the fuse by a predetermined thickness, which facilitates blowing of the fuse during a repair process. The inter-layer dielectric layers 12', 17' and 22' and the fuse 23' and 24' do not need to be formed separately and may be formed together when the inter-layer dielectric layers 12, 17 and 22 in the cell region and the upper plate electrode 23 and 24 for the capacitor are formed, respectively. As aforementioned, the fuse is formed to repair a failure in a semiconductor memory device. Generally, the fuse is not formed through a separate process, but it is formed using a conductive layer, e.g., a polysilicon layer, forming bit lines and/or word lines in a cell region.

However, as semiconductor devices become highly integrated, the overall dimensions of the semiconductor devices may increase, i.e., the height of semiconductor device structures may become larger. In order to form a fuse with relatively smaller structural dimensions, which fuse includes word lines and/or bit lines, one or more inter-layer dielectric layers may need to be removed to form a fuse box in a separate step, which adds extra complicacy to the whole process. To resolve this problem, a conductive layer formed in the upper portion of a semiconductor device may be also used as a fuse line. To be specific, a metal line or a conductive layer for forming a plate electrode of a capacitor may be also used as a fuse line. The fuse 23' and 24' illustrated in FIG. 1 is formed of a conductive layer for forming the plate electrodes 23 and 24 of a capacitor formed in a cell region. For example, the height of the semiconductor memory device from a substrate to the uppermost layer may be large so that a fuse is formed using a metal line layer.

Figure 2:
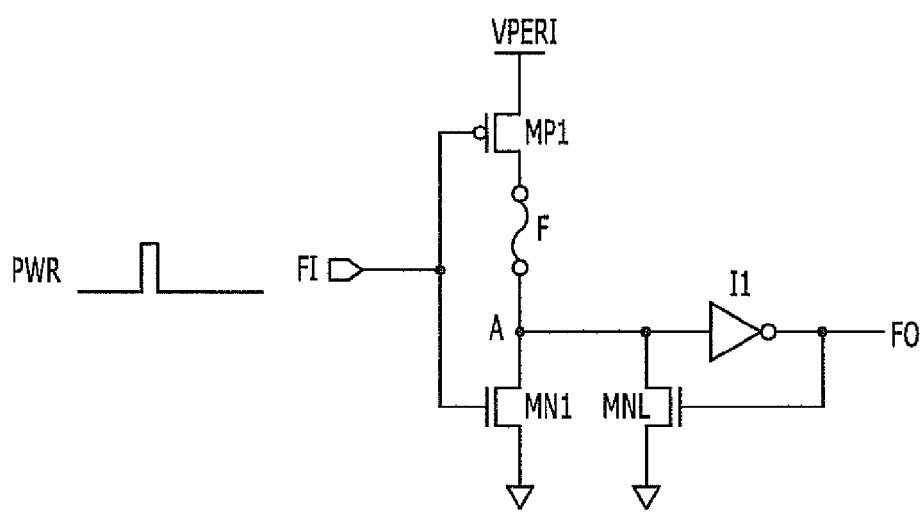
FIG. 2 is a circuit diagram illustrating a fuse unit of a semiconductor memory device, according to an embodiment of the present invention.

FIG. 2 is a circuit diagram illustrating a fuse unit of a semiconductor memory device, according to an embodiment of the present invention.

Referring to FIG. 2, the fuse unit includes a first NMOS transistor MN1 and a PMOS transistor MP1, a fuse F, an inverter I1, and a second NMOS transistor MNL. The inverter I1 and the second NMOS transistor MNL form a latch unit. The fuse F is a portion to be blown by laser irradiation. A power-up signal PWR is input to an input end FI of the fuse unit. The power-up signal PWR is activated when power is provided to a semiconductor memory device and stabilized at a predetermined voltage level. Upon the activation of the power-up signal PWR, it can be seen that a voltage needed for internal operation is applied to the semiconductor memory device.

When the power-up signal PWR is input at a logic low level, the PMOS transistor MP1 is turned on and a voltage of a repair node A is at a logic high level. When the voltage of the repair node A is at the logic high level, an output signal FO of the inverter I1 transitions to a logic low level. In this state, when the fuse F is blown by being irradiated with a laser and the power-up signal PWR transitions to a logic high level, the first NMOS transistor MN1 is turned on, and thus the signal of the repair node A transitions to a logic low level while the output signal FO of the inverter I1 transitions to a logic high level. When the output signal FO of the inverter I1 transitions to a logic high level, input and output ends of the inverter I1 are latched through the MOS transistor MNL. Once the fuse F is blown, when the voltage level of the power-up signal PWR goes back to a logic low level, the voltage level of the repair node A does not become a logic high level even if the PMOS transistor MP1 is turned on.

If the fuse F is not blown, the voltage level of the repair node A transitions to a logic high level, and thus the output signal of the inverter I1 becomes a logic low level.

Therefore, the voltage level of the output signal FO is different depending on whether the fuse F is blown, and whether the power-up signal PWR is input. Decision to replace a defective cell with a spare cell may be determined based on the voltage level of the output signal FO. An actual semiconductor memory device may include as many fuses as the number of bits of an address to be compared, although a semiconductor memory device can also have a higher or lower number of fuses, as desired. A replaced address may be indicated by selectively blowing the fuses of each fuse unit.

Figure 3A:
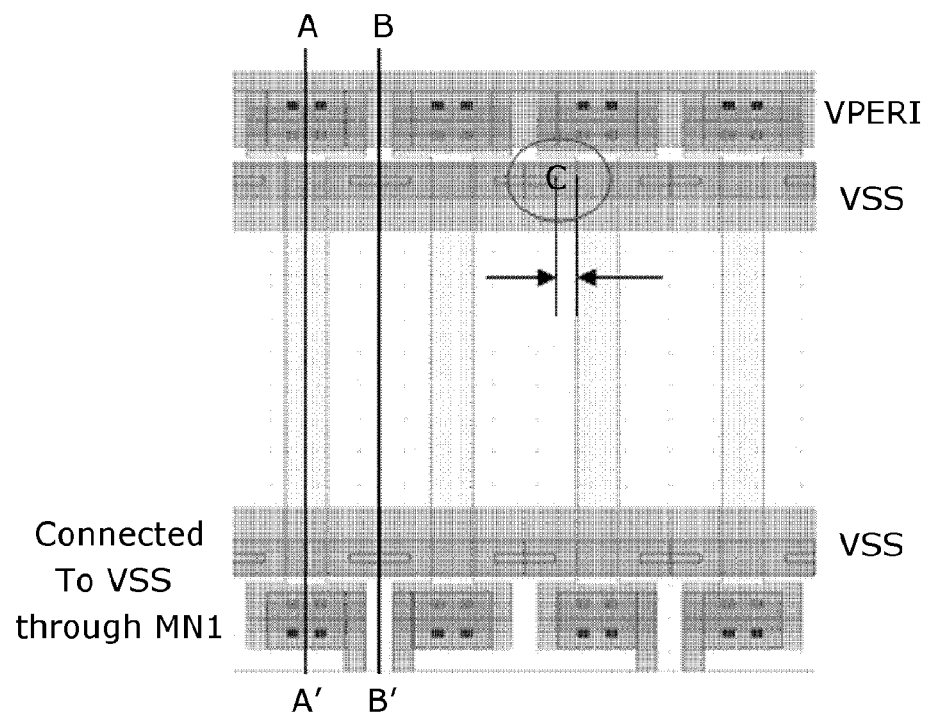
FIGS. 3A and 3B are cross-sectional views showing oxidation caused around a fuse by the operation of the fuse unit illustrated in FIG. 2, according to an embodiment of the present invention.
Figure 3B:
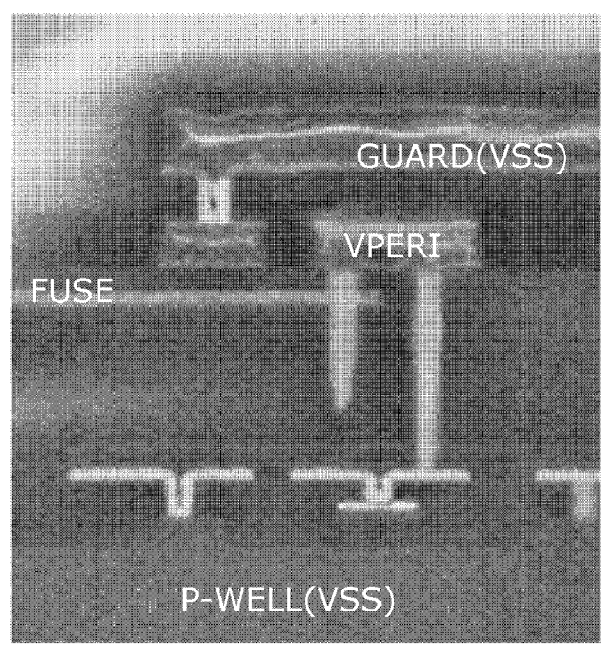

FIGS. 3A and 3B are cross-sectional views showing oxidation around a fuse caused by the operation of the fuse unit illustrated in FIG. 2, according to an embodiment of the present invention. FIG. 3A shows a layout of the fuse unit, and FIG. 3B is an electronic microscopic picture showing that the fuse unit is corroded, according to an embodiment of the present invention.

Most of an insulation layer in the upper portion of the fuse unit is removed so that the fuse unit is irradiated with a laser during a test process. When fuses are formed from metal and moisture permeates into the fuse unit, the fuses and the metal layers in the peripheral region of the fuses usually get corroded. A guard ring surrounds the peripheral region of the fuses with a first metal line layer, a second metal line layer, a first contact, and a second contact. Since the fuse unit forms the guard ring of a metal layer around the fuses, the metal layer itself may be corroded. Particularly, as the voltage difference between both ends of the fuse gets larger, severity of corrosion of the metal layer becomes worse. Therefore, it is advantageous to reduce the voltage difference.

As illustrated in the layout of FIG. 3A, since a voltage difference is induced between the fuse and the guard ring for protecting the peripheral region of the fuse unit from moisture permeation, the corrosion of the fuse unit may worsen. When the fuses are corroded, they are swollen, and the swollen fuses may cause a protective layer to be cracked, which leads to corrosion of a metal layer in an adjacent circuit.

The corrosion of a metal fuse, also referred to as anodization of a metal fuse, can occur under various levels of humidity, temperature, and voltage difference between the two ends (i.e., sides) of the fuse. In a conventional circuit, when a fuse is blown, the voltage level of one side of the blown fuse is raised to the voltage level of a peripheral region while the voltage level of the other side comes down to a ground voltage level. Since the voltage difference between the two sides of the fuse may become large, the fuse may corrode readily.

As semiconductor memory devices are developed to be faster and highly integrated, the number of line layers used therein may be increased. Also, cell capacitors may be realized stereoscopically to increase the capacitance of a capacitor in a unit cell of a semiconductor memory device. As a result, the thickness of an inter-layer dielectric layer between a gate pattern and a metal line is increased. Therefore, a metal layer over the gate pattern may be used as a fuse, instead of just using the gate pattern.

To increase the capacitance of a capacitor in a unit cell, a plate electrode of the capacitor is formed of a metal layer such as a titanium nitride layer, instead of a typical polysilicon layer. The fuse may also be formed using a metal layer as well instead of a polysilicon layer (which has been conventionally used.)

Since the fuses are formed using a metal layer, such as a titanium nitride layer, an aluminum layer, and/or a copper layer, moisture may permeate into the fuse unit during a reliability test, in which bias is applied in a high-temperature and high-humidity environment, and thereby the fuses may be corroded. For example, the reliability test may be a highly accelerated storage test (HAST) performed at 130° C. with a humidity of 85% @VCC, a temperature humidity bias (THB) test performed at 85° C. with a humidity of 85% @VCC, or a Pressure Cook Test (PCT), although other conditions and/or tests are contemplated. Here, "@VCC" means "at a power supply voltage (VCC)". When the fuses are corroded, the address changed during a repair process may not be properly recognized in a semiconductor memory device. To minimize this from occurring and to protect the fuse from the moisture permeation, a nitride layer may be additionally deposited over the fuse unit, or a polysilicon layer may be formed in the upper portion of the fuses after the laser irradiation. This method, however, increases the steps of a fabrication process and may not perfectly protect the fuses from moisture permeation through a cross section of the blown fuse.

In an embodiment of the present invention, a diode implemented with a MOS transistor is inserted to the fuse unit to lower a voltage at one terminal of the fuse. That is, the voltage at one terminal of the fuse is deducted by a threshold voltage from a supply voltage. As a result, the fuse unit, by lowering a bias voltage of the fuse, may protect a fuse from being corroded even when the fuse is blown.

Figure 4:
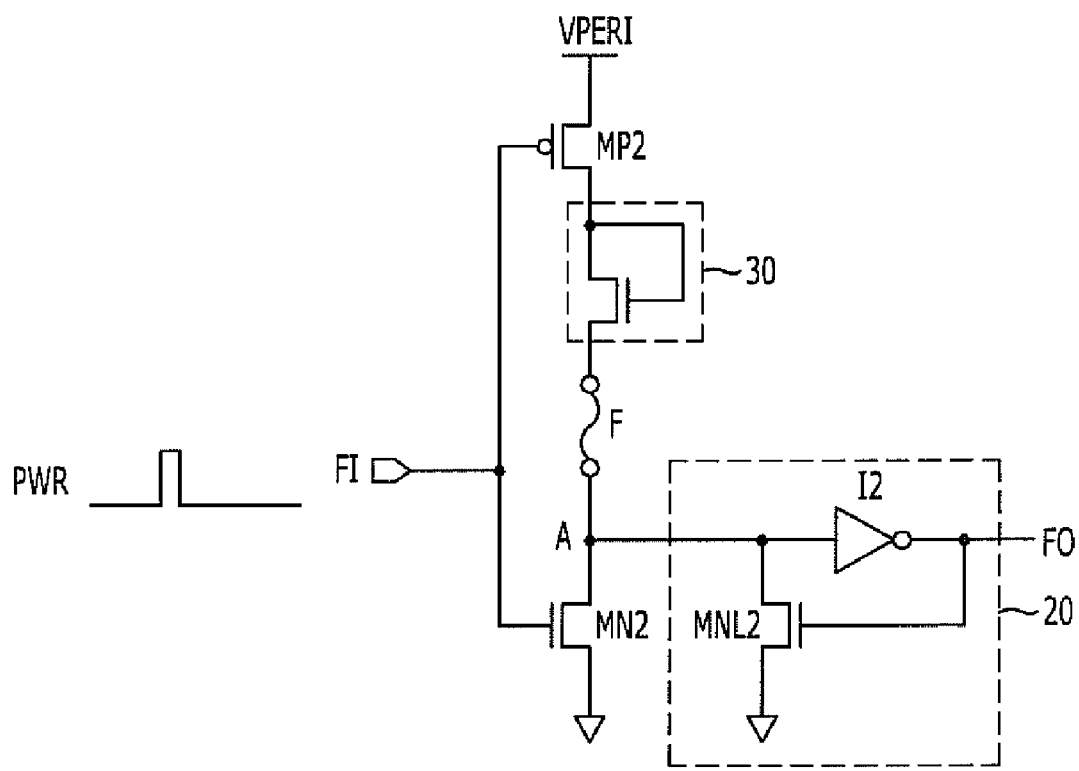
FIG. 4 is a circuit diagram illustrating a fuse unit of a semiconductor memory device, according to an embodiment of the present invention.

FIG. 4 is a circuit diagram illustrating a fuse unit of a semiconductor memory device, according to an embodiment of the present invention.

Referring to FIG. 4, the fuse unit of the semiconductor memory device includes a first NMOS transistor MN2 and a PMOS transistor MP2 whose gates are coupled to an input end FI of the fuse unit, a fuse F, a diode unit 30 located between the PMOS transistor MP2 and the fuse F, and a latch unit 20 including an inverter I2, and a second NMOS transistor MNL2. The fuse F includes a first side and a second side, with the first side coupled to a repair node A.

Since an operation of an output end FO is at least similar with that described above with reference to FIG. 2 (i.e., that the voltage level of the output signal FO is different depending on whether the fuse F is blown or not and whether the power-up signal PWR is input), its detailed description will be omitted or simplified for conciseness.

The first NMOS transistor MN2 acts as a pull-down unit for supplying a ground voltage to the repair node A, and the PMOS transistor MP2 acts as a pull-up unit for selectively supplying a driving voltage to the repair node A. Specifically, the pull-up unit may be configured to selectively transfer the driving voltage to the second side of the fuse F. In this embodiment, a peripheral circuit voltage VPERI is used as the driving voltage.

The fuse unit of the semiconductor memory device accordance to an embodiment of the present invention includes the diode unit 30 located between the PMOS transistor MP2 and the fuse F. That is, when the fuse is blown, a diode 30 is inserted to one terminal of the fuse F, usually to the terminal where the voltage level is greater than 0 V. As a result, it is possible to lower the voltage difference between both ends (i.e., the first and second sides) of the fuse. Herein, the fuse can be formed using a metal layer, such as a titanium nitride layer and an aluminum layer.

As described above, according to an embodiment, the fuse unit 30 of the memory device lowers a voltage at one terminal of the fuse when a PMOS transistor PM2 is turned on, i.e., after a power-up signal PWR is input. To be specific, the voltage at one terminal of the fuse is deducted by a threshold voltage of a diode unit from a supply voltage. As a result, the fuse unit can protect a fuse from being corroded by lowering a voltage difference between the fuse and a guard ring around the fuse.

The semiconductor memory device, in accordance with the embodiments described herein, can protect the area around a fuse from being corroded in a high-temperature and high-humidity environment. Accordingly, when a semiconductor memory device is fabricated in accordance with the embodiments described herein, the product reliability of the semiconductor memory device can be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a repair node;
a fuse having a first side coupled to the repair node;
a pull-down unit configured to selectively transfer a ground voltage to the repair node;
a pull-up unit configured to selectively transfer a driving voltage to a second side of the fuse; and
a voltage drop unit coupled between the pull-up unit and the fuse and configured to lower a voltage level of the driving voltage,
wherein the voltage drop unit includes a diode-connected MOS transistor and the diode-connected MOS transistor is coupled between the pull-up unit and the second side of the fuse.

2. The semiconductor memory device of claim 1, further comprising a latch unit configured to latch a signal at the repair node.

3. The semiconductor memory device of claim 2, wherein the latch unit includes:
an inverter; and
an N-type metal-oxide semiconductor (NMOS) transistor coupled between an input of the inverter and a ground voltage supply terminal, and having a gate coupled to an output of the inverter.

4. The semiconductor memory device of claim 1, wherein the pull-up unit includes a P-type MOS (PMOS) transistor receiving a power-up signal through a gate of the PMOS transistor.

5. The semiconductor memory device of claim 1, wherein the pull-down unit includes an N-type MOS (NMOS) transistor receiving a power-up signal through a gate of the NMOS transistor.

6. The semiconductor memory device of claim 1, wherein the fuse is formed on a substrate and includes a polysilicon layer formed over the substrate, a titanium nitride layer formed over the polysilicon layer and an inter-layer dielectric layer covering the titanium nitride layer.

7. The semiconductor memory device of claim 6, wherein the fuse includes a guard ring formed under the polysilicon layer and the guard ring is arranged to prevent moisture permeation over the substrate.

8. The semiconductor memory device of claim 6, wherein the semiconductor memory device includes a fuse region and a cell region, the fuse is formed in the fuse region, the inter-layer dielectric layer covers over both the fuse region and the cell region, and the inter-layer dielectric layer is thinner over the fuse than over the cell region.

* * * * *